(12) United States Patent
Ozalevli et al.

(10) Patent No.: US 7,843,246 B2
(45) Date of Patent: Nov. 30, 2010

(54) CLAMP CONTROL CIRCUIT HAVING CURRENT FEEDBACK

(75) Inventors: Erhan Ozalevli, Dallas, TX (US);
Luthuli Dake, McKinney, TX (US);
Rashed Anam, McKinney, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 197 days.

(21) Appl. No.: 12/269,181

(22) Filed: Nov. 12, 2008

(65) Prior Publication Data

US 2010/0117707 A1 May 13, 2010

(51) Int. Cl.
*H03K 5/08* (2006.01)

(52) U.S. Cl. .................. 327/309; 327/110; 327/318; 327/323

(58) Field of Classification Search .......... 327/110, 327/309, 318–328
See application file for complete search history.

(56) References Cited

U.S. PATENT DOCUMENTS

| | | | | |
|---|---|---|---|---|
| 5,523,714 A | * | 6/1996 | Topp et al. | 327/427 |
| 5,561,391 A | * | 10/1996 | Wellnitz et al. | 327/309 |
| 5,920,224 A | * | 7/1999 | Preslar | 327/326 |
| 6,078,204 A | | 6/2000 | Cooper et al. | |
| 6,169,439 B1 | * | 1/2001 | Teggatz et al. | 327/309 |
| 6,667,607 B2 | | 12/2003 | Kawamura et al. | |
| 6,956,425 B2 | * | 10/2005 | Adams | 327/309 |
| 7,251,163 B2 | | 7/2007 | O | |
| 7,365,584 B2 | * | 4/2008 | Bennett et al. | 327/170 |
| 7,548,097 B2 | * | 6/2009 | Dake et al. | 327/110 |

* cited by examiner

*Primary Examiner*—Lincoln Donovan
*Assistant Examiner*—Patrick O'Neill
(74) *Attorney, Agent, or Firm*—William B. Kempler; Wade J. Brady, III; Frederick J. Telecky, Jr.

(57) ABSTRACT

In accordance with an aspect of the present invention, an external FET driving circuit includes a driving portion, a drain-to-gate clamp portion and a current feedback portion. The driving portion provides a driving signal to the external FET. The drain-to-gate clamp portion protects the external FET from flyback current, when the external FET is quickly turned OFF. The current feedback portion controls the driving signal provided by the driver.

20 Claims, 2 Drawing Sheets

CLAMP CONTROL CIRCUIT HAVING CURRENT FEEDBACK

BACKGROUND

In power applications involving an integrated circuit control element, an inductive load is typically driven by a power field effect transistor (FET). When the FET is turned off, the inductive load will have a fly-back voltage associated therewith due to the inductive storage of energy therein. This fly-back will cause the voltage on the drain of an N-channel FET utilized for the driving element to rise to a relatively high level. Voltage excursions that exceed the junction breakdown voltage of an FET, can damage the FET.

In order to protect the FET, a clamp circuit is typically connected between the drain and gate of the FET. When the voltage on the drain of the FET rises to a sufficiently high level, current will conduct through the clamp, pulling the gate of the FET high and turning on the FET, this effectively prevents the fly-back voltage from pulling the drain above the clamp voltage. Conventional clamp circuits use a series of Zener diodes, each having a breakdown voltage that, when added together, comprise the overall threshold voltage for the clamp.

One disadvantage to prior art clamp circuits is the current level that must be accommodated by the clamp. Whenever the fly-back voltage pulls the drain of the FET high, current will flow from the drain to the gate, some passing through the driving circuit that drives the FET. This is a finite amount of current, which can be sufficiently high to require relatively robust components in the clamp. Therefore, the design of a clamp circuit that will accommodate the necessary current levels requires relatively large devices. This can become a disadvantage in that the clamp circuits are typically incorporated into the integrated circuit that drives the FET.

An exemplary external FET driving circuit having a drain-to-gate clamp in accordance with the conventional design will now be described with reference to FIG. 1.

Circuit 100 includes a driver portion 102, a drain-to-gate clamp portion 104 and an inductive load portion 106. Driver portion 102 includes a driver 108, a positive current source 110, a negative current source 112, a positive side current mirror 114, a negative side current mirror 116. Positive current source 110 includes a first current source 118 and switch 120, whereas negative current source 112 includes a second current source 122 and a switch 124. Positive side current mirror 114 includes P-channel FET 126 and P-channel FET 128, whereas negative side current mirror 116 includes N-channel FET 130 and N-channel FET 132. Driver portion 102 provides a driving signal to node 144 to drive the gate of an external FET 148. The drain of FET 148 is connected to an inductive load portion 142, whereas the source of FET 148 is connected to ground.

Drain-to-gate clamp portion 104 includes a diode 134, Zener diode 136, Zener diode 138 and resistor 140. Clamp portion 104 is used to prevent FET 148 from being damaged by fly-back-induced voltage excursions.

Inductive load portion 106 includes an inductor 142. Inductive load 106 represents the external applied element driven by FET 148 in power application.

In this design, the voltage-clamp is achieved by utilizing a Zener diode stack together with a forward biased diode and a resistor. During the fly-back, a large inductor current is generated and this current flows into the Zener diode stack. Therefore, most of the current is dissipated by the diodes and is used to counteract the gate-driver current. Once the current in the Zener diode stack exceeds the gate-driver current, the gate-driver output voltage starts to increase and turns on the external FET. This, in turn, allows dissipating some of the inductor current and prevents exceeding the drain-to-gate breakdown voltage. This implementation will be described in more detail below.

In operation, in general, driver portion 102 provides a driving signal to the gate of external FET 148 via node 144. When external FET is turned OFF, an inductive load as provided by inductor 142 will have a fly-back voltage. This fly-back voltage creates a first current path that flows through drain-to-gate clamp portion 104 to ground. In such an instance, drain-to-gate clamp portion 104 turns on FET 148, which then provides a second current path to ground for the fly-back voltage to prevent damage to external FET 148. A more detailed discussion of the operation is described below.

In operation, driver 108 receives an input signal 150 and generates ON and OFF signals to control current source 110 and 112. In this example, a portion of input signal 150 is illustrated with high logic state portions 154 and 158 and low logic state portions 152 and 156. In the high logic state portions 154 and 158, driver 108 outputs a high logic signal to positive current source 110 and outputs a low logic signal to negative current source 112. In the low logic state portions 152 and 156, driver 108 outputs a low logic signal to positive current source 110 and outputs a high logic signal to negative current source 112.

When positive current source 110 receives a high logic signal, switch 120 is closed, which electrically connects first current source 118 to positive side current mirror 114, which in turn provides a current $I_{p1}$ to P-channel FET 126 of current mirror 114. Current mirror 114 then generates current $I_{p2}$ out of P-channel FET 128 from current $I_{p1}$. Current $I_{p1}$ creates a voltage Vg at node 144. Further, when positive current source 110 receives a high logic signal, negative current source 112 receives a low logic signal. In such a case, switch 124 is opened, which electrically disconnects second current source 122 from negative side current mirror 116.

Alternatively, when negative current source 112 receives a high logic signal, switch 124 is closed, which electrically connects second current source 122 to negative side current mirror 116, in turn provides a current $I_{n1}$ to N-channel FET 130 of current mirror 116. Current mirror 116 then generates current $I_{n2}$ out of N-channel FET 132 from current $I_{n1}$. Further, when negative current source 112 receives a high logic signal, positive current source 110 receives a low logic signal. In such a case, switch 120 is opened, which electrically disconnects first current source 118 from positive side current mirror 114.

The current mirror ratio for both positive side current mirror 114 and negative side current mirror 116 is N:1, where N>1, which achieves high current delivery at node 144.

When external FET 148, connected to inductive load 142, turns Off quickly, a fly-back current $I_L$ is experienced. During this event, the drain of FET 148 exhibits a large transient swing that needs to be clamped for drain-to-gate protection of the device. In other words, if the fly-back current flows from the drain of FET 148 to the gate of FET 148, the FET can be damaged. The voltage-clamp is achieved by drain-to-gate clamp portion 104. During the fly-back, a large inductor current $I_L$ is generated and this current flows into the drain-to-gate clamp portion 104 as $I_d$. Most of the current is dissipated by Zener diode 136 and Zener diode 138, and is used to counteract the gate-driver current, $I_{n2}$. Once $I_d$ exceeds the gate-driver current, $I_{n2}$, the gate-driver output voltage $V_g$ starts to increase. External FET 148 will be turned on after $V_g$ exceeds the threshold voltage of FET 148. This, in turn, allows dissipating some of fly-back current $I_L$ by providing a ground path to $I_{ext}$. Consequently, $I_L$ is limited and prevented from exceeding the drain-to-gate breakdown voltage of FET 148.

However, the conventional implementation discussed above requires a very high $I_d$ current in order to turn ON external FET 148 efficiently. The reason is that $I_d$ must counteract the gate-driver current, either $I_{p2}$ or $I_{n2}$, first before it is able to turn on external FET 148. To accommodate high $I_d$ current, Zener diode 136 and Zener diode 138 must be of sufficient size for high current flow. As the power consumption is proportional to current and size of the transistor or diode, the requests of high current $I_d$ and large size Zener diode 136 and Zener diode 138 result in high power consumption and increased area. Thus, the power consumption problem and increased area associated with the conventional design become more significant problems in high-voltage applications.

What is needed is a FET driving circuit having a drain-to-gate clamp portion that consumes less power and has a smaller area than that of conventional FET driving circuits.

BRIEF SUMMARY

It is an object of the present invention to provide a FET driving circuit having a drain-to-gate clamp portion that consumes less power and has a smaller area than that of conventional FET driving circuits.

In accordance with an aspect of the present invention, a circuit is operable to receive an input signal and to provide a driving voltage, based on the input signal, to an external FET having a gate, a drain and a source. The circuit comprises a driving portion, an inductive load portion and a drain-to-gate clamp portion. The driving portion is operable to receive the input signal. The driving portion may comprise a positive current source, a negative current source, a first current mirror associated with the positive current source and a second current mirror associated with the negative current source. The positive current source may be operable to provide a positive voltage to the gate of the external FET via the first current mirror. The negative current source may be operable to provide a voltage, which is close to ground, to the gate of the external FET via the second current mirror. The drain-to-gate clamp portion may comprise a third current mirror and a fourth current mirror. The third current mirror may be associated with the negative current source. The fourth current mirror may be associated with the positive current source.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, an external FET driving circuit having a drain-to-gate clamp includes a current feedback portion to control a driving signal provided by a driver portion of the driving circuit.

An exemplary external FET driving circuit having a drain-to-gate clamp in accordance with the present invention will now be described with reference to FIG. 2.

Figure 1:
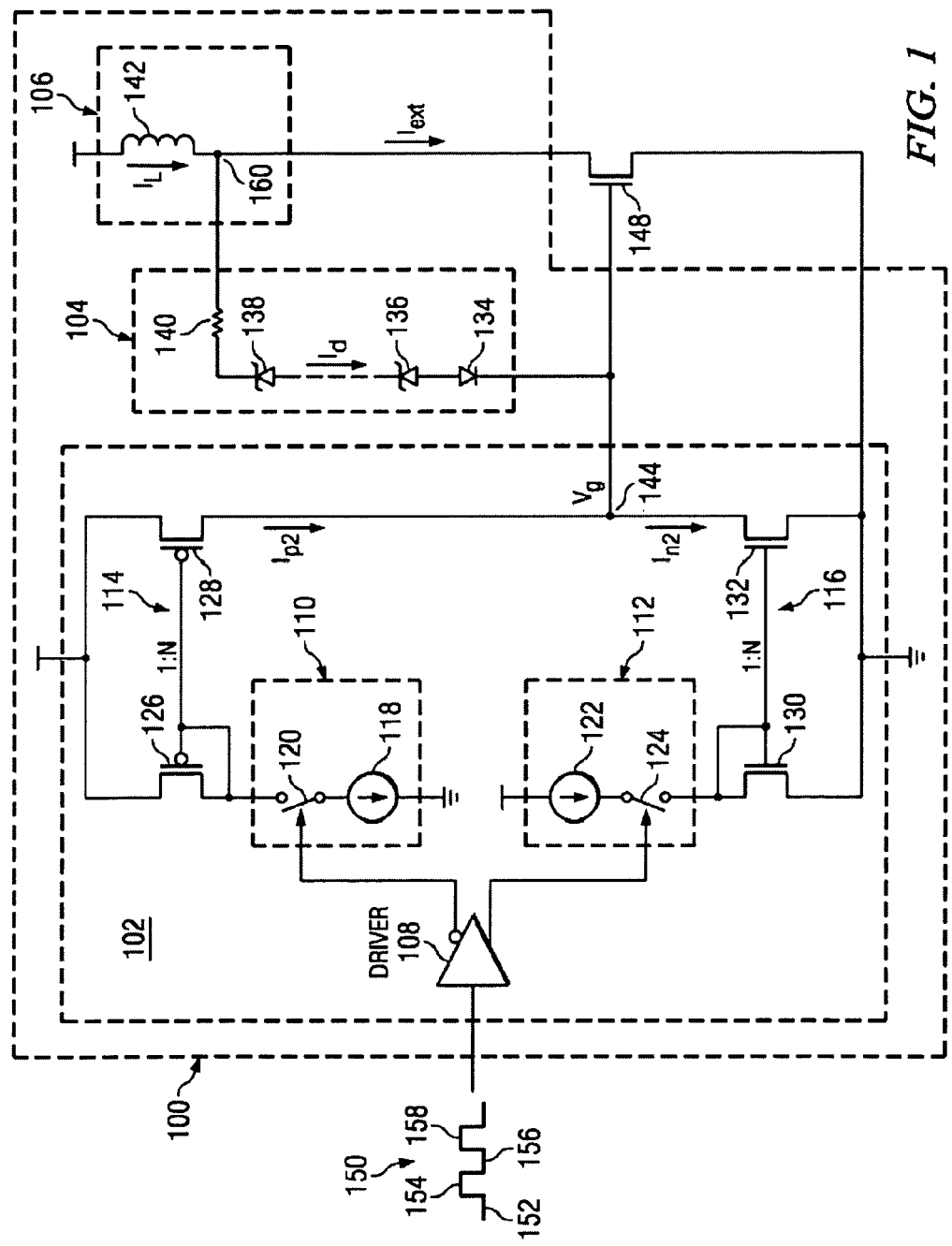
FIG. 1 illustrates an external FET driving circuit having a prior art drain-to-gate clamp.

In the figure, external FET driving circuit 200 differs from the circuit 100 of FIG. 1. Specifically, drain-to-gate clamp portion 104 of circuit 100 is replaced with a drain-to-gate clamp portion 202 in external FET driving circuit 200. Drain-to-gate clamp portion 202 includes a resistor 204, a Zener diode 206, a Zener diode 208, a first current mirror 210 and a second current mirror 212. First current mirror 210 includes an N-channel FET 214 and an N-channel FET 218. Second current mirror 212 includes an N-channel FET 216 and shares N-channel FET 218 with first current mirror 210.

Current mirrors 210 and 212 are used to provide a current-feedback to driver portion 102. The current mirror ratio of current mirrors 212 and 210, as defined by N-channel FET 218: N-channel FET 216: N-channel FET 214 is M:M:1, where M>1. In other words, a current $I_{n5}$ provided to N-channel FET 218 will be mirrored and amplified by a factor M in $I_{n4}$ for N-channel FET 216 and will be mirrored and amplified by the factor M in $I_{n3}$ for N-channel FET 214.

In operation, when input signal 150 causes driver 108 to open switch 124 and close switch 120, second current source 118 becomes electrically connected to positive side current mirror 114, which in turn provides current $I_{p2}$ to node 144. Current $I_{p2}$ at node 144 turns ON external FET 148.

However, when input signal 150 causes driver 108 to open switch 120 and close switch 124, second current source 122 becomes electrically connected to negative side current mirror 116, which in turn provides current $I_{n2}$ to node 144. Current $I_{n2}$ at node 144 quickly turns off external FET 148, thus creating fly-back current $I_L$. After external FET 148 is turned OFF, the drain-to-source of FET 132 becomes the low impedance path. In this case, $I_{p2}$ becomes zero and $I_{n2}$ becomes in the range of mA providing a path for $I_d$ to flow. When the voltage on node 160 rises to a level that exceeds the sum of the Zener breakdown voltage of the Zener diodes 206 and 208, current $I_d$ flows. In order to reduce the diode current $I_d$, and thereby reduce the power consumption, a high impedance path to ground may be provided to turn on external FET 148.

In present invention, $I_d$ is current $I_{n5}$. Current $I_{n5}$ generates current $I_{n4}$ via current mirror 212 and generates current $I_{n3}$ via current mirror 210. Further, as a result of the amplification factor M of each of current mirror 212 and current mirror 210, each of currents $I_{n4}$ and $I_{n3}$ have a value of M·$I_{n5}$, or M·$I_d$.

Figure 2:
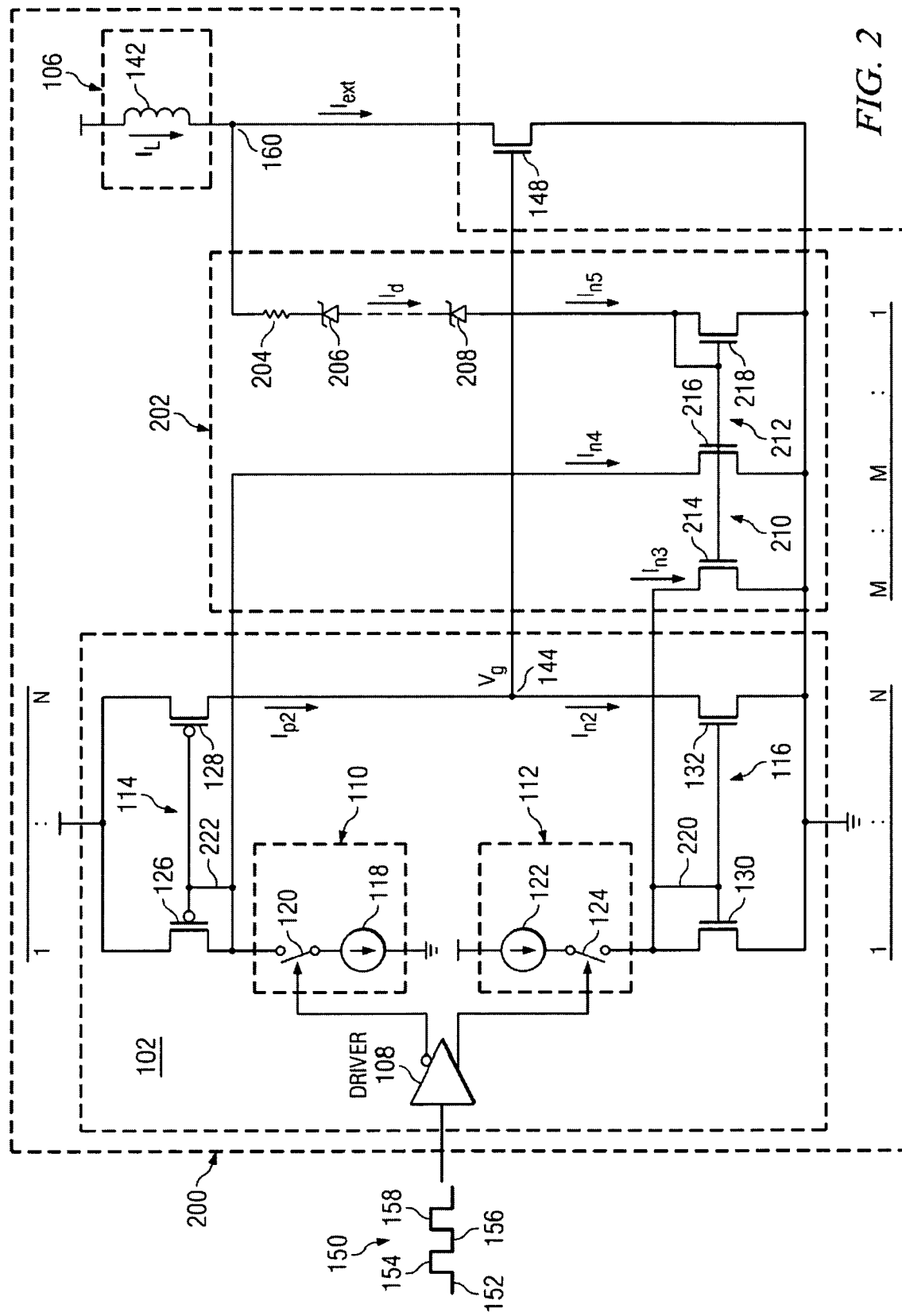
FIG. 2 illustrates an external FET driving circuit having a drain-to-gate clamp in accordance with an exemplary embodiment of the present invention.

As illustrated in FIG. 2, N-channel FET 214 of current mirror 210 is in electrical connection with P-channel FET 130 of negative side current mirror 116. As a result, current $I_{n3}$ saps current from current $I_{n1}$. Once current $I_{n1}$ is decreased, current $I_{n2}$ is then decreased via current mirror 116. More importantly, current $I_{n2}$ is decreased by a factor N over the decrease in current $I_{n2}$ as a result of the amplification factor of negative side current mirror 116. Because $I_{n3}$ is amplified by a factor M over current $I_{n5}$, which is current $I_d$, current $I_{n2}$ is decreased by a factor N·M·$I_d$. In other words, a small current $I_d$ will greatly decrease current $I_{n2}$.

Similarly, N-channel FET 216 of current mirror 212 is in electrical connection with P-channel FET 126 of positive side current mirror 114. Positive side current mirror 114 increases $I_{p2}$ by an amplification factor N over $I_{n4}$. Because $I_{n4}$ is amplified by a factor M over current $I_{n5}$, which is current $I_d$, current $I_{p2}$ is increased by a factor $N \cdot M \cdot I_d$. In other words, a small current $I_d$ will greatly increase current $I_{p2}$.

The combinational increase of $I_{p2}$ and decrease of $I_{n2}$, resulting from the current mirror feedback system in accordance with the present invention, causes a decrease in $I_d$. Further, as a result of the amplification factor M of the current mirror feedback system, used in conjunction with the amplification factor N of each of the driver current mirrors, a much smaller $I_d$ is needed to actuate the gate-to-drain clamp. Therefore, the required Zener diode current $I_d$ in present invention is at least M·N times less than the required Zener diode current in prior art system discussed above with respect to FIG. 1.

In some embodiments in accordance with the present invention, the amplification factor M of the current mirror feedback system is equal to the amplification factor N of each of the driver current mirrors. In other embodiments in accordance with the present invention, the amplification factor M of the current mirror feedback system is not equal to the amplification factor N of each of the driver current mirrors. More particularly, in some embodiments in accordance with the present invention, the amplification factor M of the current mirror feedback system is less than the amplification factor N of each of the driver current mirrors. Further, in some embodiments in accordance with the present invention, the amplification factor M of the current mirror feedback system is greater than the amplification factor N of each of the driver current mirrors.

For the reasons discussed above, a drain-to-gate clamp portion of an external FET driving circuit in accordance with the present invention may use Zener diodes that are much smaller than a drain-to-gate clamp portion of a conventional external FET driving circuit. Therefore a drain-to-gate clamp portion of an external FET driving circuit in accordance with the present invention has much less power consumption and has much smaller area on the diode path than the drain-to-gate clamp portion of a conventional external FET driving circuit.

Furthermore, an external FET driving circuit in accordance with the present invention requires a voltage to be applied that is relative to ground, as compared to the conventional external FET driving circuit, which requires a voltage to be applied that is relative to the gate of the external FET, to turn on the external FET efficiently. As such, external FET driving circuit in accordance with the present invention is independent of threshold of the external FET, creating more flexibility in the choices of external FETs.

In the embodiment discussed above, a current feedback portion includes a third current mirror and a fourth current mirror, wherein the third current mirror is associated with a negative current source of the driver portion, and wherein the fourth current mirror is associated with the positive current source of the driver portion. Other embodiments may include a larger number or smaller number of current mirrors within the current feedback portion. More particularly, any arrangement of current mirrors may be used, so long as current feedback is provided to control the driving signal.

In the embodiments discussed above, the drain-to-gate clamp portion includes two Zener diodes. Other embodiments may include a larger number or smaller number of Zener diodes, depending on the desired breakdown voltage design constraints.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit operable to receive an input signal and to provide a driving voltage, based on the input signal, to an external FET having a gate, a drain and a source, said circuit comprising:
    a driving portion operable to receive the input signal, said driving portion comprising a positive current source, a negative current source, a first current mirror associated with said positive current source and a second current mirror associated with said negative current source, said positive current source being operable to provide a positive voltage to the gate of the external FET via said first current mirror, said negative current source being operable to provide a first voltage to the gate of the external FET via said second current mirror;
    an inductive load portion;
    a drain-to-gate clamp portion; and
    a current feedback portion comprising a third current mirror and a fourth current mirror, said third current mirror being associated with said negative current source, said fourth current mirror being associated with said positive current source.

2. The circuit of claim 1, wherein said drain-to-gate clamp portion further comprises a resistor and a Zener diode.

3. The circuit of claim 2, wherein said resistor is in electrical connection with said inductive load portion and said Zener diode.

4. The circuit of claim 3,
    wherein said third current mirror comprises a third current mirror input FET and a third current mirror output FET,
    wherein said fourth current mirror comprises a fourth current mirror input FET and a fourth current mirror output FET,
    wherein said third current mirror input FET and said fourth current mirror input FET are in electrical connection with said Zener diode, and
    wherein said third current mirror input FET and said fourth current mirror input FET are the same FET.

5. The circuit of claim 4,
    wherein said third current mirror output FET is in electrical connection with said first current mirror, and
    wherein said fourth current mirror output FET is in electrical connection with said second current mirror.

6. The circuit of claim 5,
    wherein said first current mirror has an input-to-output ratio of 1:N,
    wherein said second current mirror has an input-to-output ratio of 1:N,
    wherein said third current mirror has an input-to-output ratio of 1:M,
    wherein said fourth current mirror has an input-to-output ratio of 1:M, and
    wherein $M \geq N$.

7. The circuit of claim 3,
    wherein said third current mirror comprises a third current mirror input FET and a third current mirror output FET,
    wherein said fourth current mirror comprises a fourth current mirror input FET and a fourth current mirror output FET, wherein said third current mirror output FET is in electrical connection with said first current mirror, and wherein said fourth current mirror output FET is in electrical connection with said second current mirror.

8. The circuit of claim 7, wherein said first current mirror has an input-to-output ratio of 1:N, wherein said second current mirror has an input-to-output ratio of 1:N, wherein said third current mirror has an input-to-output ratio of 1:M, wherein said fourth current mirror has an input-to-output ratio of 1:M, and wherein $M \geq N$.

9. The circuit of claim 1, wherein said third current mirror comprises a third current mirror input FET and a third current mirror output FET, wherein said fourth current mirror comprises a fourth current mirror input FET and a fourth current mirror output FET, wherein said third current mirror output FET is in electrical connection with said first current mirror, and wherein said fourth current mirror output FET is in electrical connection with said second current mirror.

10. The circuit of claim 9, wherein said first current mirror has an input-to-output ratio of 1:N, wherein said second current mirror has an input-to-output ratio of 1:N, wherein said third current mirror has an input-to-output ratio of 1:M, wherein said fourth current mirror has an input-to-output ratio of 1:M, and wherein $M \geq N$.

11. The circuit of claim 1, wherein said first current mirror has an input-to-output ratio of 1:N, wherein said second current mirror has an input-to-output ratio of 1:N, wherein said third current mirror has an input-to-output ratio of 1:M, wherein said fourth current mirror has an input-to-output ratio of 1:M, and wherein $M \geq N$.

12. The circuit of claim 1, wherein said inductive load portion and said drain-to-gate clamp portion are in electrical connection with the drain of the external FET.

13. A circuit operable to receive an input signal, said circuit comprising:

a FET having a gate, a drain and a source;

a driving portion operable to receive the input signal, said driving portion comprising a positive current source, a negative current source, a first current mirror associated with said positive current source and a second current mirror associated with said negative current source, said positive current source being operable to provide a positive voltage to said gate of said FET via said first current mirror, said negative current source being operable to provide a first voltage to said gate of said FET via said second current mirror;

an inductive load portion;

a drain-to-gate clamp portion; and a current feedback portion comprising a third current mirror and a fourth current mirror, said third current mirror being associated with said negative current source, said fourth current mirror being associated with said positive current source.

14. The circuit of claim 13, wherein said drain-to-gate clamp portion further comprises a resistor and a Zener diode.

15. The circuit of claim 14, wherein said resistor is in electrical connection with said inductive load portion and said Zener diode.

16. The circuit of claim 15, wherein said third current mirror comprises a third current mirror input FET and a third current mirror output FET, wherein said fourth current mirror comprises a fourth current mirror input FET and a fourth current mirror output FET, wherein said third current mirror input FET and said fourth current mirror input FET are in electrical connection with said Zener diode, and wherein said third current mirror input FET and said fourth current mirror input FET are the same FET.

17. The circuit of claim 16, wherein said third current mirror output FET is in electrical connection with said first current mirror, and wherein said fourth current mirror output FET is in electrical connection with said second current mirror.

18. The circuit of claim 17, wherein said first current mirror has an input-to-output ratio of 1:N, wherein said second current mirror has an input-to-output ratio of 1:N, wherein said third current mirror has an input-to-output ratio of 1:M, wherein said fourth current mirror has an input-to-output ratio of 1:M, and wherein $M \geq N$.

19. The circuit of claim 15, wherein said third current mirror comprises a third current mirror input FET and a third current mirror output FET, wherein said fourth current mirror comprises a fourth current mirror input FET and a fourth current mirror output FET, wherein said third current mirror output FET is in electrical connection with said first current mirror, and wherein said fourth current mirror output FET is in electrical connection with said second current mirror.

20. A circuit operable to receive an input signal, said circuit comprising:

a FET having a gate, a drain and a source;

a driving portion operable to receive the input signal, said driving portion comprising a positive current source, a negative current source, a first current mirror associated with said positive current source and a second current mirror associated with said negative current source, said positive current source being operable to provide a positive voltage to said gate of said FET via said first current mirror, said negative current source being operable to provide a first voltage to said gate of said FET via said second current mirror;

an inductive load portion;

a drain-to-gate clamp portion; and a current feedback portion comprising a third current mirror and a fourth current mirror, said third current mirror being associated with said negative current source, said fourth current mirror being associated with said positive current source;

wherein said third current mirror comprises a third current mirror input FET and a third current mirror output FET, wherein said fourth current mirror comprises a fourth current mirror input FET and a fourth current mirror output FET, wherein said third current mirror output FET is in electrical connection with said first current mirror,
wherein said fourth current mirror output FET is in electrical connection with said second current mirror,
wherein said first current mirror has an input-to-output ratio of 1:N,
wherein said second current mirror has an input-to-output ratio of 1:N,
wherein said third current mirror has an input-to-output ratio of 1:M
wherein said fourth current mirror has an input-to-output ratio of 1:M, and
wherein M≧N.

* * * * *